(12) United States Patent
Lamers et al.

(10) Patent No.: US 11,067,486 B2
(45) Date of Patent: Jul. 20, 2021

(54) ELECTRON MICROSCOPY

(71) Applicant: UNITED KINGDOM RESEARCH AND INNOVATION, Swindon (GB)

(72) Inventors: Meindert Hugo Lamers, Cambridge (GB); Rafael Fernandez-Leiro, Cambridge (GB); Joshua Firman, Cambridge (GB)

(73) Assignee: United Kingdom Research and Innovation, Swindon (GB)

( * ) Notice: Subject to any disclaimer, the term of this patent is extended or adjusted under 35 U.S.C. 154(b) by 357 days.

(21) Appl. No.: 16/320,961

(22) PCT Filed: Jul. 28, 2017

(86) PCT No.: PCT/EP2017/069240
§ 371 (c)(1),
(2) Date: Jan. 25, 2019

(87) PCT Pub. No.: WO2018/020036
PCT Pub. Date: Feb. 1, 2018

(65) Prior Publication Data
US 2019/0170618 A1 Jun. 6, 2019

(30) Foreign Application Priority Data
Jul. 29, 2016 (GB) ..................................... 1613173

(51) Int. Cl.
*G01N 1/00* (2006.01)
*G01N 1/31* (2006.01)
(Continued)

(52) U.S. Cl.
CPC ............ *G01N 1/312* (2013.01); *B01L 3/5085* (2013.01); *B01L 7/50* (2013.01); *B01L 9/523* (2013.01);
(Continued)

(58) Field of Classification Search
USPC ................................................... 250/440.11
See application file for complete search history.

(56) References Cited

U.S. PATENT DOCUMENTS

| 4,727,029 A | 2/1988 | Mori |
| 7,112,790 B1 * | 9/2006 | Wang .................. H01J 37/3056 250/307 |

(Continued)

FOREIGN PATENT DOCUMENTS

| GB | 2461708 A | 1/2010 |
| GB | 2537579 A | 10/2016 |

(Continued)

OTHER PUBLICATIONS

Search Report prepared by UK Intellectual Property Office in Application No. GB1613173.2 dated Mar. 8, 2017.
(Continued)

*Primary Examiner* — Phillip A Johnston
(74) *Attorney, Agent, or Firm* — Cooley LLP

(57) ABSTRACT

Aspects and embodiments relate to electron microscopy sample preparation apparatus; and a method of preparing an electron microscopy sample. Aspects and embodiments provide electron microscopy sample preparation apparatus. The apparatus comprises a support holder configured to receive an electron microscopy sample support, the electron microscopy sample support configured to receive a fluid sample. The apparatus comprising a gas outlet configured to direct a flow of gas towards a surface of the electron microscopy sample support to adjust fluid supported by the electron microscopy sample support. Aspects and embodiments recognise that in order to be successfully imaged, a specimen must be adequately prepared for imaging. Successful and reproducible preparation of an electron microscopy sample or specimen may be key to obtaining useful results from microscopy techniques. It will be appreciated that incorrect
(Continued)

or unsuccessful preparation of a specimen for examination, may result in damage to a specimen, poor and/or irreproducible results.

15 Claims, 9 Drawing Sheets

(51) Int. Cl.
*G01N 1/28* (2006.01)
*H01J 37/02* (2006.01)
*H01J 37/20* (2006.01)
*G01N 30/12* (2006.01)
*B01L 3/00* (2006.01)
*B01L 7/00* (2006.01)
*B01L 9/00* (2006.01)

(52) U.S. Cl.
CPC ............ *G01N 1/2813* (2013.01); *G01N 30/12* (2013.01); *H01J 37/023* (2013.01); *H01J 37/20* (2013.01); *B01L 2300/1894* (2013.01); *H01J 2237/002* (2013.01)

(56) References Cited

U.S. PATENT DOCUMENTS

| | | | | |
|---|---|---|---|---|
| 9,312,095 | B2* | 4/2016 | Tripathi | ............... H01J 37/20 |
| 9,927,398 | B2* | 3/2018 | Reid | ................ B01L 3/50273 |
| 9,947,505 | B2* | 4/2018 | Russo | ............ G01N 33/54393 |
| 10,157,725 | B2* | 12/2018 | Passmore | ............... H01J 37/06 |
| 10,241,062 | B2* | 3/2019 | Ominami | ........... G01N 23/2204 |
| 2007/0145268 | A1 | 6/2007 | Chao et al. | |
| 2009/0126373 | A1 | 5/2009 | Burg | |
| 2015/0090878 | A1 | 4/2015 | Remigy et al. | |
| 2015/0221470 | A1 | 8/2015 | Ominami et al. | |
| 2018/0052082 | A1* | 2/2018 | Groll | ...................... G01N 33/53 |

FOREIGN PATENT DOCUMENTS

| | | |
|---|---|---|
| JP | 2010054272 | 3/2010 |
| WO | 2013056685 A1 | 4/2013 |
| WO | 2015086485 A1 | 6/2015 |

OTHER PUBLICATIONS

International Search Report and Written Opinion prepared by the European Patent Office in PCT/EP2017/069240, dated Nov. 16, 2017.

* cited by examiner

Protein:10---25nm
20nm thick
1.2um holes

ELECTRON MICROSCOPY

FIELD OF THE INVENTION

The present invention relates to electron microscopy sample preparation apparatus; and a method of preparing an electron microscopy sample.

BACKGROUND

Microscopy techniques can be used to image a specimen. Microscopy techniques include electron microscopy. According to such techniques, a beam of electrons is used to "illuminate" a specimen. The presence of the specimen in the electron beam results in changes to that beam. The changes to the beam induced by the sample can be examined to create a magnified image of the specimen.

In order to be successfully imaged, a specimen must be adequately prepared for imaging. Successful and reproducible preparation of a sample or specimen may be key to obtaining useful results from microscopy techniques. It will be appreciated that incorrect or unsuccessful preparation of a specimen for examination, may result in damage to a specimen, poor and/or irreproducible results.

It is desired to provide an apparatus and method, for use in preparation of microscopy samples, which may address some of the features of known preparation techniques.

SUMMARY

A first aspect provides electron microscopy sample preparation apparatus; the apparatus comprising: a support holder configured to receive an electron microscopy sample support, the electron microscopy sample support configured to receive a fluid sample; and a gas outlet configured to direct a flow of gas towards a surface of the electron microscopy sample support to adjust fluid supported by the electron microscopy sample support.

The apparatus and method described may be of use in relation to various microscopy sample preparation methods, but may have particular relevance in relation to electron microscopy, in particular cryo-microscopy, also known as cryo-electron microscopy or cryo-EM, in which transmission electron microscopy is used to study specimens at cryogenic temperatures. Electron cryomicroscopy techniques can be particularly useful in the study of vitrified, hydrated biological specimens. The significance of reproducible and reliable preparation techniques may be of particular significance to users of cryo-electron microscopy since a sample may be prepared weeks in advance of a scheduled slot to use an electron microscope and, if the samples prepared are not usable, time may be lost preparing further samples (which may also be unusable) and waiting for a further scheduled slot to use the electron microscope.

The first aspect may provide electron microscopy sample preparation apparatus. The electron microscopy sample preparation apparatus may comprise cryo-electron microscopy sample preparation apparatus. Said apparatus may comprise stand-alone apparatus, or may form part of a larger preparation machine.

The apparatus of the first aspect may comprise: a support holder configured to receive an electron microscopy sample support. The electron microscopy sample support may be configured to receive a fluid sample. The fluid sample may comprise a solution containing a biological specimen. The sample support may comprise an electron microscopy sample support grid.

The apparatus may comprise a gas outlet configured to direct a flow of gas towards a surface of the electron microscopy sample support to adjust fluid supported by the electron microscopy sample support. The gas may comprise compressed air, nitrogen or another similar inert gas which does not detrimentally interact with a specimen within the fluid. In some embodiments, configuration of the gas outlet may be selected in dependence upon the desired properties of the resulting directable flow of gas. In some embodiments, the gas flow rate may be adjustable, the gas flow may be initiated and ceased as appropriate. In some embodiments, the gas flow rate may be adjusted during gas flow, that is to say, while the gas is flowing from the outlet. The gas flow may be substantially laminar. The outlet may be arranged or configured such that the resulting gas flow is substantially uniform across the width of a sample support when that sample support is in place within the sample support holder.

The first aspect recognises that use of a flow of gas to adjust a fluid sample placed upon a sample support may allow for reproducible sample preparation. Furthermore, use of a flow of gas to adjust a fluid sample placed upon a sample support may allow for fine adjustment of parameters of the gas flow and thus fine adjustment of various properties of a sample provided on the sample support.

In some embodiments, the gas outlet is configured such that the flow of gas is directable towards the surface such that flow of the gas is substantially parallel to the surface. In some embodiments, the gas outlet is configured such that the flow of gas is directable towards the surface at an angle of incidence selected such that the flow of the gas is operable to remove an excess of the fluid sample received on the electron microscopy sample support. It will be appreciated that the flow of gas may act to "push" excess fluid from the sample support. Excess fluid on a sample support may result in a sample which is too thick to image effectively.

A gas flow which is substantially parallel to the support surface may act to create a gradient within the fluid across the support surface. In some embodiments, the gas outlet is configured such that the flow of gas is directable towards the surface at an angle of incidence selected such that the flow of the gas is operable to create a gradient within the fluid across the support surface. Creation of a gradient may allow for an optimum thickness of fluid for electron microscopy imaging to occur at some point across the support surface. That optimum thickness may occur in a plurality of positions across the support surface. If the support is, for example, a grid, that optimum thickness may occur at a plurality of grid squares which occur on the support sample surface. The optimum thickness may depend upon the specimen to be imaged by electron microscopy and which is suspended within the fluid placed upon the sample support.

In some embodiments, the gas outlet is configured such that the flow of gas is directable towards the surface which results in a flow of gas which is substantially perpendicular to the surface. In some embodiments, the gas outlet is configured such that the resulting flow of gas is directed towards the surface at an angle of incidence selected such that a cross-section of the flow of gas is configured to pass across the surface area of the electron microscopy sample support surface substantially uniformly. Such gas flows may result in even evaporation occurring across the surface area of a sample support. Some embodiments recognise that if the direction of the gas flow is substantially perpendicular to the sample support surface, it may be possible to avoid creation of a fluid gradient across the sample support, and achieve a more uniform sample for subsequent imaging.

A substantially perpendicular gas flow may also, for example, in some embodiments, be used to spread a "droplet" of sample fluid across a sample support. In some embodiments, the gas outlet is configured such that the flow of gas is directable towards the surface at an angle of incidence selected such that the flow of the gas is operable to spread a "droplet" of sample fluid across a sample support.

It will be appreciated that an appropriately chosen perpendicular, parallel, and/or transverse gas flow having an appropriately selected angle of incidence, cross sectional area and/or flow rate may be used, with an appropriate gas, to implement various actions in relation to preparation of a sample. In particular, a gas flow may be used to adjust the fluid provided on the sample support. That adjustment may comprise one or more of: removal of excess fluid, spread fluid, evaporate fluid from the sample support, cool a sample fluid, and/or vitrify a sample fluid. In some embodiments, the same gas flow may be used to perform more than one action or adjustment. In some embodiments, one or more physical properties of the gas flow may be altered to achieve the various actions. For example, the flow rate, gas, humidity, temperature, angle of incidence and/or similar properties of the gas flow may be changed appropriately.

In some embodiments, a gas flow may be used to cool, cryogenically cool, or vitrify a fluid sample on a sample support. In some embodiments, cryogenic cooling may comprise cooling the fluid sample and sample support to approximately −175 degrees Centigrade. That cooling, or vitrifying may, if the "flow front" of a gas flow is configured to impact a sample support surface evenly and uniformly, be configured such that even cooling, cryogenic cooling or vitrifying across the sample support is achieved. "Even cooling" in this context means that the cooling process may be such that no significant temperature differentials are induced by application of the gas flow between areas of fluid on the support. Temperature differentials can result in physical detriment to the fluid sample on the support and cause issues in subsequent electron microscopy imaging.

In some embodiments, the gas outlet may be configured to be moveable such that the gas flow has an adjustable angle of incidence with respect to flow of the gas towards the surface. Accordingly, some apparatus arrangements may comprise a fixed-position gas outlet, other arrangements may provide for a moveable gas outlet. If moveable, the angle of incidence of the gas flow with the sample support surface may be adjustable. The angle of incidence of the gas flow may, in some embodiments, be adjustable during application of a gas flow to a sample support. In some embodiments, one angle of incidence may be used to perform removal of excess fluid, and evaporation of sample fluid from the sample support. In other words, the same angle of gas flow incidence may be used to perform both actions. Other physical properties of the gas flow may be adjusted, or remain the same. In some embodiments, one angle of incidence may be used to perform removal of excess fluid, and another angle of incidence may be used to implement evaporation of the fluid on the sample support. The angle of incidence of the gas flow may, in some embodiments, be adjustable between applications of a gas flow to a sample support.

As described previously, the gas flow may be used, according to various embodiments, to achieve a range of adjustments to fluid placed on a sample support. The adjustment achieved may depend, in some embodiments, upon the nature of the gas flow. For example, the direction of application of the gas flow, the cross sectional area of the gas flow, the gas used for the gas flow, the humidity of the gas flow, the temperature of the gas flow and other similar physical properties and characteristics of the gas flow. The properties of the gas flow may depend upon the configuration of the gas outlet. The gas outlet may comprise a nozzle shaped to create a gas flow having particular physical characteristics. In some embodiments, adjusting fluid supported by the electron microscopy sample support comprises removing excess fluid supported by the electron microscopy sample support. In some embodiments, adjusting fluid supported by the electron microscopy sample support comprises causing non-uniform evaporation of fluid supported by the electron microscopy sample support to obtain a fluid thickness gradient across the sample support. In some embodiments, adjusting fluid supported by the electron microscopy sample support comprises causing uniform evaporation of fluid supported by the electron microscopy sample support to obtain a uniform fluid thickness across the sample support. In some embodiments, adjusting fluid supported by the electron microscopy sample support comprises causing cooling of fluid supported by the electron microscopy sample support. In some embodiments, adjusting fluid supported by the electron microscopy sample support comprises causing cryogenic cooling of fluid supported by the electron microscopy sample support. In some embodiments, adjusting fluid supported by the electron microscopy sample support comprises vitrifying fluid supported by the electron microscopy sample support.

In some embodiments, the apparatus comprises: a single gas outlet configured to direct the flow of gas substantially symmetrically towards opposing surfaces of the electron microscopy sample support to adjust fluid supported by the electron microscopy sample support. Such an arrangement may ensure that a sample support is not warped or otherwise physically damaged upon application of the gas flow to the sample support. In some embodiments, a single gas outlet may be used to create a gas flow directed towards only one surface of the sample support, and adjust the fluid on the sample support from only one side or surface thereof.

In some embodiments, the apparatus comprises: at least one gas outlet configured to direct the flow of gas substantially symmetrically towards opposing surfaces of the electron microscopy sample support to adjust fluid supported by the electron microscopy sample support. In some embodiments, the apparatus comprises: at least two gas outlets configured to direct the flow of gas substantially symmetrically and simultaneously towards opposing surfaces of the electron microscopy sample support to adjust fluid supported by the electron microscopy sample support. In some embodiments, the apparatus comprises: two gas outlets configured to direct the flow of gas substantially symmetrically and simultaneously towards opposing surfaces of the electron microscopy sample support to adjust fluid supported by the electron microscopy sample support.

Various symmetrical arrangements as described above may help to ensure that a sample support is not warped or otherwise physically damaged upon application of the gas flow to the sample support.

In some embodiments, the apparatus comprises: a gas humidifier configured to adjust the humidity of the gas flow. Accordingly, the humidity of the gas flow may have an impact upon the rate of evaporation induced by a gas flow upon fluid supported by a sample support. In some embodiments, the apparatus may comprise a gas flow temperature regulation device, configured to control or adjust the temperature of the gas flow. In some embodiments, the apparatus may further comprise a housing. Temperature within said housing may be monitored and controllable to control evaporation of a fluid from a sample support.

In some embodiments, the apparatus comprises: a fluid source configured to introduce the fluid sample to the sample support. In some embodiments, a fluid may be manually introduced onto a sample support held in the apparatus sample support holder. In other embodiments, a dispenser, for example a robotic dispenser arm, may be provided configured such that it is operable to introduce a fluid onto a sample support held in the apparatus sample support holder. Provision of a fluid dispenser may allow for more full automation of electron microscopy sample preparation and may lead to more reproducible electron microscopy samples, and/or use of less sample fluid. Where a specimen may be limited, it may be beneficial to use less of the sample fluid when preparing electron microscopy samples.

In some embodiments, the apparatus comprises: a cooling, cryogenic cooling and/or vitrifying device. That device may be configured to cool, cryogenically cool, and/or vitrify a sample fluid on the sample support. The device may be configured to receive the sample support and sample fluid and cool, cryogenically cool and/or vitrify the fluid on the sample support. Accordingly, the apparatus may include a means to vitrify the sample fluid before the sample supports are stored before final imaging. In some embodiments, the cooling device comprises: a liquid ethane bath configured to receive the sample support. In some embodiments, the cooling device comprises: a gas outlet configured to direct a flow of cooling, cryogenic cooling or vitrifying gas towards a surface of the electron microscopy sample support to cool, cryogenically cool and/or vitrify fluid supported by the electron microscopy sample support. Accordingly, for example, liquid nitrogen or similar may be used to create a cooling nitrogen gas flow. In some embodiments, the gas outlet and the cooling gas outlet comprise the same gas outlet. Accordingly, the gas source may be changed between creation of a gas flow for adjusting the position of a fluid on the sample support and creation of a gas flow for cooling or vitrifying a fluid on the sample support.

In some embodiments, the apparatus comprises: a timing unit configured to implement a wait period between introduction of fluid to the sample support and activation of the gas flow from the gas outlet. Accordingly, the implemented wait time may allow for a fluid droplet to "wet" a sample support.

In some embodiments, the apparatus comprises: a timing unit configured to implement an active period between activation and cessation of the gas flow from the outlet. Accordingly, the amount of fluid removed, via excess sample removal and/or by evaporation of a fluid from a sample support, may be adjusted by means of adjustment of the exposure time (active period) of a fluid on a sample support to the gas flow.

In some embodiments, the apparatus comprises: a timing unit configured to implement a relaxation period between cessation of the gas flow from the outlet and a further action taken, for example, cooling, cryogenic cooling or vitrification, in relation to a sample fluid placed on a sample support held in the sample holder. Accordingly, the uniformity of a sample fluid supported on a sample support may be adjusted by adjustment of the relaxation period to allow a fluid sample to relax for a longer or shorter period of time on the sample support before a further action is taken.

In some embodiments, the timing unit is configurable to adjust one or more of the wait period, active period or relaxation period. Accordingly, the properties of a sample fluid on a sample support and resulting electron microscopy sample may be controlled.

In some embodiments, the apparatus comprises: imaging apparatus configured to image the electron microscopy sample support in the sample holder. That imaging apparatus may comprise visual, real-time imaging apparatus. Provision of such imaging apparatus may allow the sample preparation process to be monitored and adjusted in real time.

In one embodiment, the fluid sample comprises a plurality of specimens suspended in a fluid. Accordingly, the fluid sample may have one or more individual specimens or samples such as, for example, one or more macromolecules suspended in or contained by a fluid.

In one embodiment, the plurality of specimens have a specimen concentration per unit volume within the fluid. Accordingly, the specimens may be provided within the fluid at a particular concentration or density. For example, a particular number of specimens may be provided per unit volume of the fluid.

In one embodiment, the specimen concentration provides a selected number of the specimens within each imaging aperture of the sample support. Accordingly, the density or concentration of the specimens within the fluid may be selected to give a number of specimens within each aperture on the sample support. For example, the density may be selected to provide fewer than five specimens within each imaging aperture.

In one embodiment, the gas outlet is configured to direct the flow of gas to cleave the fluid sample received on the sample support. Accordingly, the flow of gas from the gas outlet may cleave, separate, split, partition or divide the sample on the sample support.

In one embodiment, the gas outlet is configured to direct the flow of gas to cleave the fluid sample received on the sample support into a retained portion of the fluid sample retained on the sample support and a removed portion of the fluid sample removed from the sample support. Accordingly, the flow of gas may cleave, separate, divide, partition or split the fluid sample into a retained portion and a removed portion. The retained portion may remain on the sample support, whereas the removed portion may be detached from the sample support.

In one embodiment, the gas outlet is configured to direct the flow of gas to cleave the fluid sample received on the sample support with the retained portion having the specimen concentration. Accordingly, the retained portion may keep the same specimen concentration or density. That is to say, the specimen concentration or density may not increase during the removal of the removed portion.

In one embodiment, the removed portion comprises specimens. Accordingly, the removed portion may contain specimens as well as fluid.

In one embodiment, the removed portion has the specimen concentration. Accordingly, the removed portion may also maintain the same specimen concentration as the original fluid sample.

In one embodiment, the apparatus comprises a fluid sample depositor operable to deposit the fluid sample on the sample support. Accordingly, a mechanism may be provided to deposit or provide the fluid sample on the sample support.

In one embodiment, the apparatus comprises a control unit operable to control the fluid sample depositor, the gas outlet and the cooling device to deposit the fluid sample, cleave the fluid sample and vitrify the retained portion within a processing period. Accordingly, the control unit may control the deposition of the sample, the cleaving of the sample and the vitrification of the retained portion so that all this occurs within a selected processing period.

In one embodiment, the processing period comprises a time period within which greater than a selected or significant proportion of the specimens in the retained portion are prevented from at least one of disassociating and reorientating to an aligned orientation. Accordingly, the time period from depositing the fluid sample through to it vitrifying may be selected to occur in less than the time within which disassociation of a selected amount of the specimens can occur. Likewise, the time period may be selected such that it is less than a time within which a selected amount of the specimens may reorientate themselves when deposited on the sample support. This helps to ensure that the specimens remain intact and that their generally random distribution within the fluid is retained.

In one embodiment, the time period minimises evaporation of the fluid. Accordingly, the time period may be such that evaporation of the fluid is minimised or substantially eliminated.

In one embodiment, the time period is less than around 1 s.

In one embodiment, the time period is less than around 100 ms.

In one embodiment, the time period comprises a sample depositing period, a cleaving period and a vitrifying period.

In one embodiment, the sample depositing period is between around 10 ms and 30 ms.

In one embodiment, the cleaving period is between around 10 ms and 20 ms.

In one embodiment, the vitrifying period is less than around 50 ms.

A second aspect provides a method of preparing an electron microscopy sample preparation; the method comprising: inserting an electron microscopy sample support into a support holder; providing a fluid sample to the electron microscopy sample support; and directing a flow of gas towards a surface of the electron microscopy sample support from a gas outlet to adjust fluid supported by the electron microscopy sample support.

In some embodiments, the method comprises: directing the flow of gas towards the surface such that flow of the gas is substantially parallel to the surface.

In some embodiments, the method comprises: directing the flow of gas towards the surface at an angle of incidence selected such that the flow of the gas is operable to remove an excess of the fluid sample received on the electron microscopy sample support.

In some embodiments, the method comprises: directing the flow of gas towards the surface such that flow of the gas is substantially perpendicular to the surface.

In some embodiments, the method comprises: directing the flow of gas towards the surface at an angle of incidence selected such that the flow of gas is configured to impact the electron microscopy sample support surface uniformly.

In some embodiments, the method comprises: adjusting the gas outlet to adjust the angle of incidence with respect to flow of the gas towards the surface.

In some embodiments, adjusting fluid supported by the electron microscopy sample support comprises removing excess fluid supported by the electron microscopy sample support.

In some embodiments, adjusting fluid supported by the electron microscopy sample support comprises causing non-uniform evaporation of fluid supported by the electron microscopy sample support to obtain a fluid thickness gradient across the sample support.

In some embodiments, adjusting fluid supported by the electron microscopy sample support comprises causing uniform evaporation of fluid supported by the electron microscopy sample support to obtain a uniform fluid thickness across the sample support.

In some embodiments, adjusting fluid supported by the electron microscopy sample support comprises causing cooling of fluid supported by the electron microscopy sample support to vitrify the fluid on the sample support.

In some embodiments, the method comprises: configuring a single gas outlet to direct the flow of gas substantially symmetrically towards opposing surfaces of the electron microscopy sample support to adjust fluid supported by the electron microscopy sample support.

In some embodiments, the method comprises: configuring at least one gas outlet to direct the flow of gas substantially symmetrically towards opposing surfaces of the electron microscopy sample support to adjust fluid supported by the electron microscopy sample support.

In some embodiments, the method comprises: configuring a gas humidifier to adjust the humidity of the gas flow.

In some embodiments, providing the fluid comprises configuring a fluid source to introduce the fluid sample to the sample support.

In some embodiments, the method comprises: configuring a cooling device to receive the sample support and fluid and cooling, cryogenically cooling and/or vitrifying the fluid on the sample support.

In some embodiments, the method comprises: configuring a liquid ethane bath to receive the sample support and cool, cryogenically cool and/or vitrify fluid on the sample support.

In some embodiments, the method comprises: providing a cooling gas outlet and configuring the cooling gas outlet to direct a flow of cooling gas towards a surface of the electron microscopy sample support to cool, cryogenically cool and/or vitrify fluid supported by the electron microscopy sample support.

In some embodiments, the method comprises: implementing a wait period between introduction of fluid to the sample support and activation of the gas flow from the gas outlet.

In some embodiments, the method comprises: implementing an active period between activation and cessation of the gas flow from the outlet.

In some embodiments, the method comprises: implementing a relaxation period between cessation of the gas flow from the outlet and a further action taken in relation to a sample support held in the sample holder.

In some embodiments, the method comprises: adjusting one or more of the wait period, active period or relaxation period.

In some embodiments, the method comprises: imaging the electron microscopy sample support in the sample holder.

In one embodiment, the method comprises providing the fluid sample with a plurality of specimens suspended in a fluid.

In one embodiment, the method comprises providing the plurality of specimens with a specimen concentration per unit volume within the fluid.

In one embodiment, the method comprises selecting the specimen concentration to provide a selected number of the specimens within each imaging aperture of the sample support.

In one embodiment, the method comprises cleaving the fluid sample received on the sample support with the flow of gas provided by the gas outlet.

In one embodiment, the method comprises cleaving the fluid sample received on the sample support into a retained portion of the fluid sample retained on the sample support and a removed portion of the fluid sample removed from the sample support.

In one embodiment, the method comprises cleaving the fluid sample received on the sample support with the retained portion having the specimen concentration.

In one embodiment, the removed portion comprises specimens.

In one embodiment, the removed portion has the specimen concentration.

In one embodiment, the method comprises depositing the fluid sample on the sample support with a fluid sample depositor.

In one embodiment, the method comprises controlling the fluid sample depositor to deposit the fluid sample, the gas outlet to cleave the fluid sample and the cooling device to vitrify the retained portion all within a selected processing period.

In one embodiment, the processing period comprises a selected time period within which fewer than a selected proportion of the specimens in the retained portion are prevented from at least one of disassociating and reorientating to an aligned orientation.

In one embodiment, the time period is selected to minimise evaporation of the fluid.

In one embodiment, the time period is less than around 1 s.

In one embodiment, the time period is less than around 100 ms.

In one embodiment, the time period comprises a sample depositing period, a cleaving period and a vitrifying period.

In one embodiment, the sample depositing period is between around 20 ms and 30 ms.

In one embodiment, the cleaving period is between around 10 ms and 20 ms.

In one embodiment, the vitrifying period is less than around 500 ms.

Further particular and preferred aspects are set out in the accompanying independent and dependent claims. Features of the dependent claims may be combined with features of the independent claims as appropriate, and in combinations other than those explicitly set out in the claims.

Where an apparatus feature is described as being operable to provide a function, it will be appreciated that this includes an apparatus feature which provides that function or which is adapted or configured to provide that function.

BRIEF DESCRIPTION OF THE DRAWINGS

Embodiments of the present invention will now be described further, with reference to the accompanying drawings, in which.

DESCRIPTION OF THE EMBODIMENTS

Before describing one possible arrangement in detail, a general overview is provided.

Microscopy techniques can be used to image a specimen. Microscopy techniques include electron microscopy. According to such techniques, a beam of electrons is used to "illuminate" a specimen. The presence of the specimen in the electron beam results in changes to that beam. The changes to the beam induced by the sample can be examined to create a magnified image of the specimen.

Recent developments in direct electron detectors used for cryo-electron microscopy (cryo-EM) have led to a surge in the number of structures determined by this method in the last 5 years: from 130 in 2009 to 521 in 2014 and even more so for high resolution structures (better than 9 Å resolution): 40 in 2009, 229 in 2015 (January-October). As the technique further develops with better microscopes, detectors and software, it has been recognised that the limiting factor in the structure determination process may become preparation of the sample. Furthermore, it has been recognised that more challenging samples are being imaged, those samples increasingly requiring time-consuming optimization of conditions. However, current methodologies to prepare samples are poorly reproducible and often detrimental for macromolecular complexes. It is thus believed that there is an urgent need for better methods to prepare samples for cryo-EM.

Aspects and embodiments recognise that in order to be successfully imaged, a specimen must be adequately prepared for imaging. Successful and reproducible preparation of a sample or specimen may be key to obtaining useful results from microscopy techniques. It will be appreciated that incorrect or unsuccessful preparation of a specimen for examination, may result in damage to a specimen, poor and/or irreproducible results.

Figure 1A:
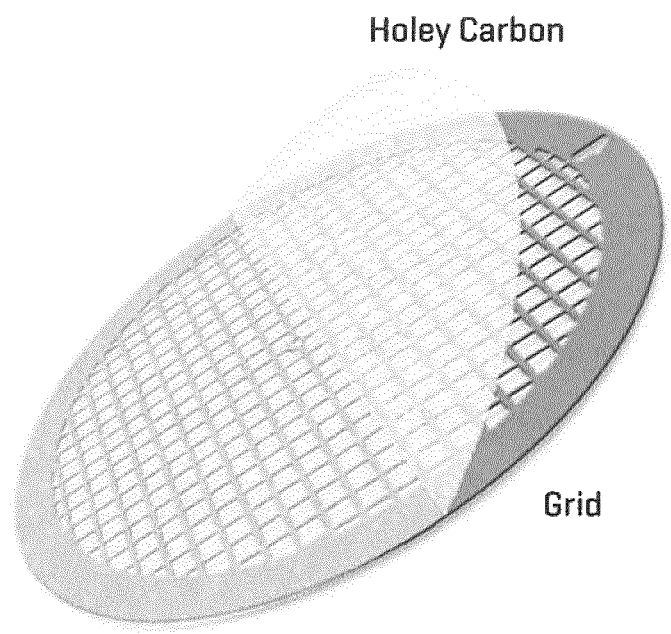
FIG. 1a and FIG. 1b illustrate schematically a microscopy sample support.
Figure 1B:
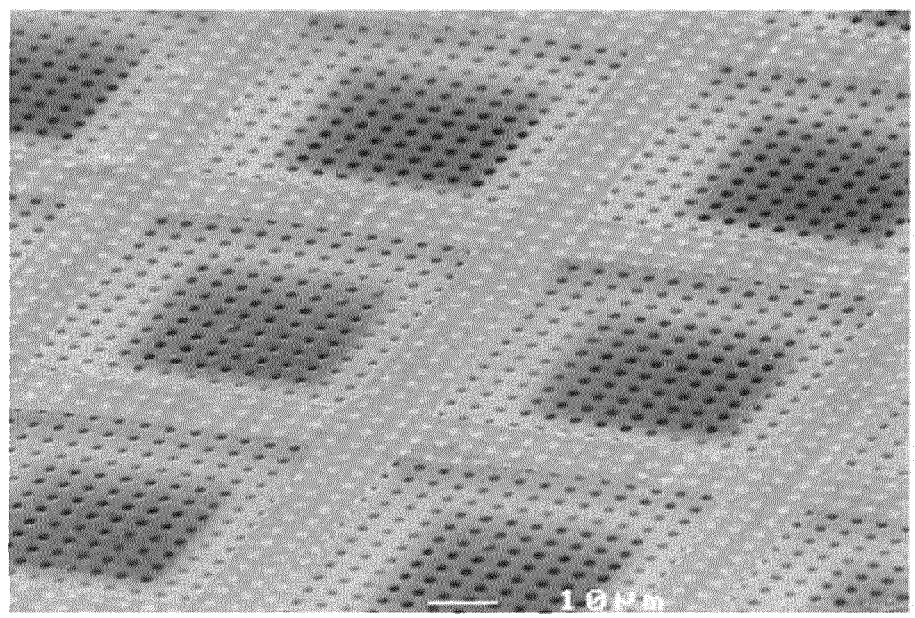

FIG. 1a and FIG. 1b illustrate schematically a typical microscopy sample support. As illustrated, it will be understood that, for cryo-EM applications, a sample support may typically comprise a metallic grid having a grid spacing of, for example, tens of micrometres. The grid may comprise a grid having square grid holes. The support may further comprise a porous film, for example, a holey carbon film, having pores of between 0.5 and 10 micrometres in diameter, suspended across the square grid holes. A fluid including proteins to be imaged may be placed on the porous film and grid (which together form the sample support). The fluid, including the protein specimen, enters the pores of the holey carbon. FIG. 1b shows, in more detail, the structure of a typical sample support. Several grid members can be seen, across which a film of holey carbon is arranged.

Figures 2A, 2B, 2C, 2D, 2E:
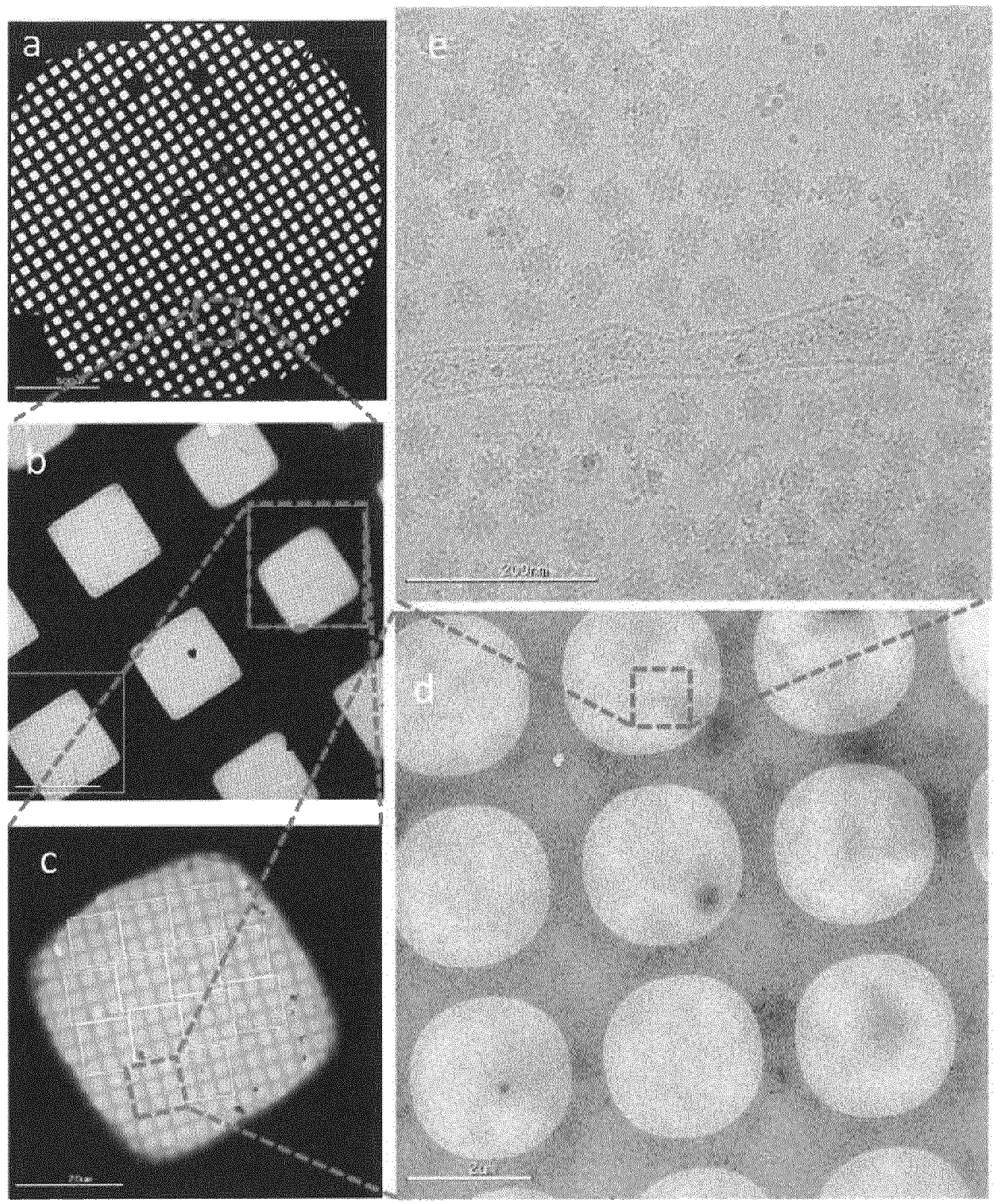
FIGS. 2a to 2e illustrate imaging of a specimen prepared on a sample support such as that shown in FIG. 1 at various level of magnification.

FIGS. 2a to 2e illustrate imaging of a specimen prepared on a sample support such as that shown in FIG. 1 at various level of magnification. FIG. 2a shows the macroscopic structure of a grid forming part of a sample support. It can be seen in FIG. 2a that there may be some damage or inconsistency across the grid. There are, as can be seen, some darkened grid squares. FIG. 2b is an image of a few of the grid squares of the sample support of FIG. 2a, in which the structure of the porous film can begin to be seen. FIG. 2c shows the structure of the holey carbon within a single grid square. FIG. 2d shows a plurality of pores of the holey carbon. FIG. 2e shows an image of proteins within a single pore of the holey carbon.

According to traditional sample preparation techniques, an electron microscopy sample or specimen is prepared for imaging in the following manner: a fluid, which includes the sample or specimen to be imaged, is manually placed upon a metal grid sample support, for example, by means of a pipette. The fluid wets and saturates the grid, filling the grid squares and, more particularly, the pores within the holey carbon within the grid holes. Excess fluid is removed and the sample support is cooled such that the fluid containing the sample is vitrified. The sample support, including the sample fluid, is then stored until an imaging slot is available at an electron microscope.

Currently, all methodologies for preparing samples for, for example, cryo-EM, use filter paper to "blot" away excess liquid from the cryo-EM grid that holds the sample. That blotting process is achieved by pressing appropriate blotting paper against one, or both, surfaces of a sample support grid. The blotting process may cause physical damage to the sample grid or sample supported on the grid. The blotting process leads to variable results in relation to the sample fluid left on the sample support. Some grid squares may be completely empty, some may include a lot of fluid. Adjacent grid squares may offer very different fluid thicknesses in the pores. Such variance across a sample support grid can lead to variable image quality. Typical success rate for a "good" grid (ie one in which a sample can be clearly imaged) prepared in accordance with a blotting method is 1-2 in every 10 grids prepared. Furthermore, it will be appreciated that the final results of the sample preparation according to the blotting technique for removal of excess sample fluid may only be evaluated in the electron microscope, an instrument that is not suitable for high throughput analysis. In other words, no quality control of prepared grids occurs until the grids reach the electron microscope for actual imaging. Consequently, sample grid preparation is currently one of the most significant bottlenecks in cryo-EM structure determination.

Arrangements recognise that there is an urgent need for a method of preparing sample grids which results in more consistent and reproducible sample grids. It is also recognised that it may be desirable to provide a method which allows determination of an indication of the quality of a sample grid, before the sample reaches full imaging, ie without the need for a cryo-electron microscope.

Overview

Arrangements recognise that it is possible to create a device which can implement a more reproducible method to prepare samples. Those samples may comprise, for example, samples for single particle or single protein cryo-EM. Devices may implement methods which use a controlled flow of gas, perhaps in a short burst, or "puff", to remove, for example, excess liquid from a sample grid. Use of a flow of gas may provide for several advantages in comparison to a method which uses filter paper for blotting. In particular, because it is possible to accurately define physical characteristics of the gas flow, for example, the pressure and the time of the puff of gas, it is possible to obtain more reproducible results from sample preparation. Furthermore, it has been found that the directionality of the gas stream may result in a fine gradient in the thickness of the sample layer being created over the width of the grid, therefore increasing the chances of getting the right thickness of fluid supporting the sample at some point on each and every grid which is prepared. Since methods which use a controlled flow of gas do not use filter paper which obscures the sample grid, it is possible, in some arrangements, to use a high resolution camera to monitor and record a grid and sample during a preparation process. Such monitoring may enable users to connect the visible properties of a grid during preparation to the final quality of the grid as observed in the cryo-electron microscope. This way, if it is found that suboptimal conditions are used during the preparation of a sample grid, it may be clearer which preparation parameters to change. Such an option may make grid preparation methods less of a "hit-and-miss" procedure, and instead provide an accurately defined technique that takes the uncertainty out of the sample preparation for microscopy techniques, including cryo-EM techniques.

The gas flow sample preparation technique also has several further advantages including the possibility of requiring a smaller sample volume, the possibility, in some embodiments, to use an alternative freezing/vitrification technique (one not reliant on plunging into liquid ethane) and incorporation of the preparation device into the microscope such that sample preparation and sample imaging become one and the same process. Ultimately, it may be possible that a user will only have to provide a sample, after which the subsequent steps can be performed without user intervention.

Taking a holistic approach to sample preparation, the gas flow sample preparation technique may, in one implementation, comprise part of a sample preparation device which utilises a plunge-freezing/vitrification arrangement to vitrify a sample grid for cryo-EM.

The sample preparation device may be configured to use a short burst or "puff" of compressed gas to remove excess sample fluid from a sample grid, leaving only a thin layer suitable for cryo-EM imaging.

Traditional sample preparation devices use filter paper to remove the excess of sample via a blotting method and are notoriously irreproducible. It has been recognised that using a gas stream in relation to sample preparation may give better control over various factors that may affect the quality of the sample which, in turn, may offer more reliable microscopy results.

Some implementations of a device may include imaging apparatus, such as a video camera, configured to monitor and record the sample grid during a preparation process. Such a recording may provide immediate feedback to a user regarding the likely quality of the sample. Traditional methods which use filter paper to "blot" cannot be similarly directly monitored since the filter paper blocks any view of the sample grid and therefore the quality of the resulting sample grid can only be properly monitored once mounted into a cryo electron microscope, hours or even days after preparation of the sample grid.

Example Device

Figure 3:
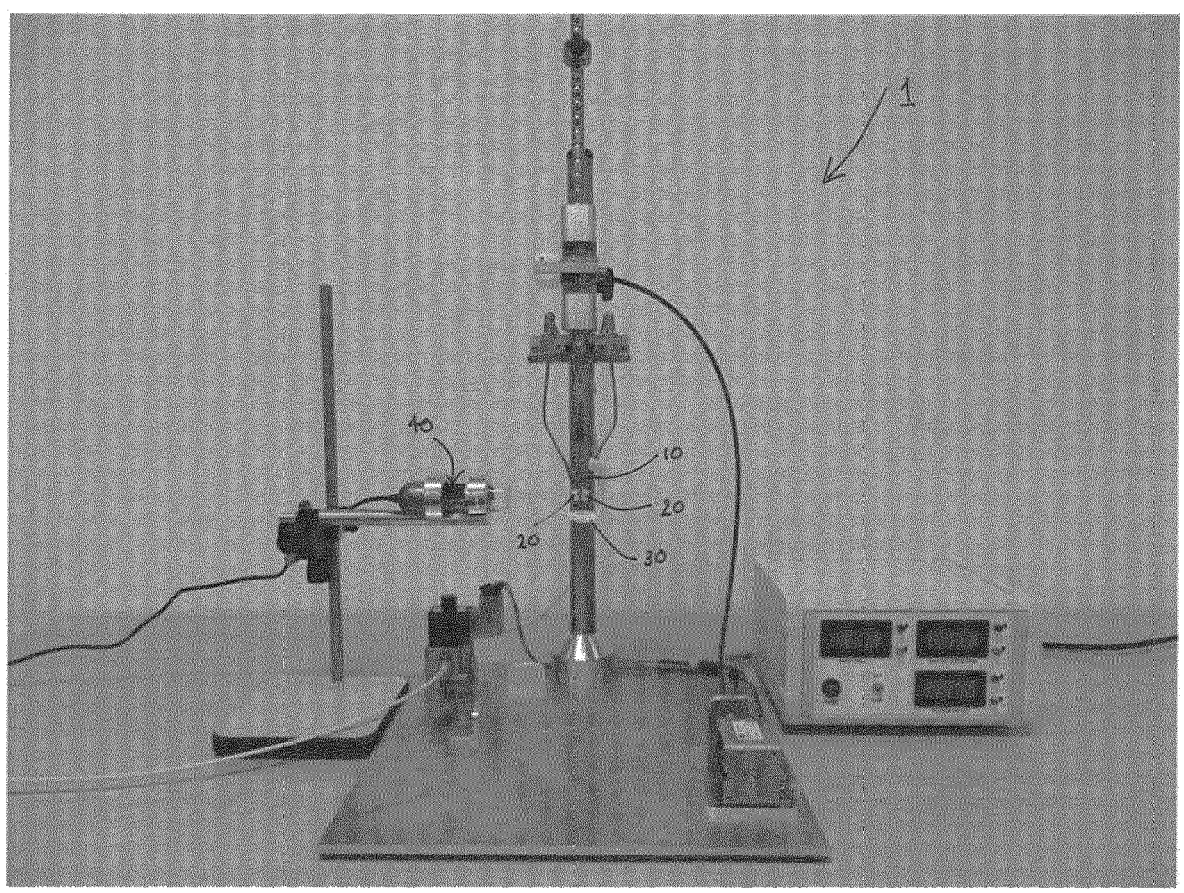
FIG. 3 illustrates main components of a device according to one arrangement.

FIG. 3 illustrates main components of a device according to one arrangement. The device shown comprises an electron microscopy sample preparation apparatus 1. The apparatus comprises: a support holder configured to receive an electron microscopy sample support 10. The electron microscopy sample support (not shown in FIG. 3) may comprise a sample support such as those shown in FIGS. 1 and 2. In particular, the sample support may be configured to receive a fluid sample. The fluid sample may comprise, for example, a protein to be studied suspended in the fluid. The apparatus may further comprise a gas outlet 20 configured to direct a flow of gas towards a surface of said electron microscopy sample support. The gas outlet 20 may comprise a nozzle which is configured to produce a flow of gas which adjusts the fluid sample supported by the electron microscopy sample support. In the example arrangement shown in FIG. 3, the apparatus comprises two gas outlets 20, arranged substantially symmetrically about the support holder 10.

The apparatus shown in FIG. 3 comprises a plunge-freeze device for vitrificaton of a sample support including a fluid sample after preparation according to gas flow arrangements described herein. Accordingly, the arrangement shown is such that the apparatus further comprises a shield 30 arranged to receive any fluid removed from a sample support by a short burst of gas from a nozzle 20. In the arrangement shown, the shield is movable such that when the sample (not shown) is plunged into liquid ethane (also not shown) in order to vitrify the fluid containing a specimen to be imaged in situ on the sample support, the shield does not impede movement of the sample support from the region of the gas outlets to the liquid ethane.

The apparatus shown in FIG. 3 further comprises camera 40 configured to record one or more images of a support located in the sample support holder 10.

Operation of an arrangement such as the one shown in FIG. 3 is such that a sample grid is placed in the sample support holder 10. A user may use a pipette to transfer or dispense a fluid sample onto the sample support. Two compressed gas streams are expelled from gas outlets 20 placed, in the example apparatus shown, at a slight angle (around 20 degrees) with respect to a surface of the sample grid supported by the support holder. The incident gas streams are used to remove excess fluid sample from the sample support. Removal of excess fluid may help to create a thin layer of sample fluid being supported on the support grid. In the example shown in FIG. 3, the outlets 20 are configured to dispense a flow of compressed nitrogen gas, but it will be appreciated that other generally inert gases may be used as appropriate. Furthermore, as discussed in detail below, some arrangements and implementations may allow for control of the humidity of a gas stream, to control the rate of evaporation of fluid from the sample support on continued exposure to the gas flow after removal of excess fluid.

In the arrangement shown, two gas nozzles deliver a flow of gas (one on each side) to the surfaces of the grid simultaneously to ensure the sample support remains in a desired position and that sample fluid adjustment by the gas flows is substantially symmetrical. After exposure to the flow of gas, the sample grid may be released or moved into liquid ethane. In the arrangement shown in FIG. 3, on release or transfer of the sample grid, the two gas nozzles 20 are connected to the plunge-trigger and are configured so that they, and the shield 30 move out of the way when the sample plunges towards liquid ethane (not shown).

Provision of imaging apparatus 40 in the arrangement shown in FIG. 3 comprises provision of video recording apparatus. Video recordal of the EM sample grid can allow for continuous real-time monitoring of the sample, giving direct feedback about the likely resulting quality of the fluid sample supported by the grid.

Figure 4A:
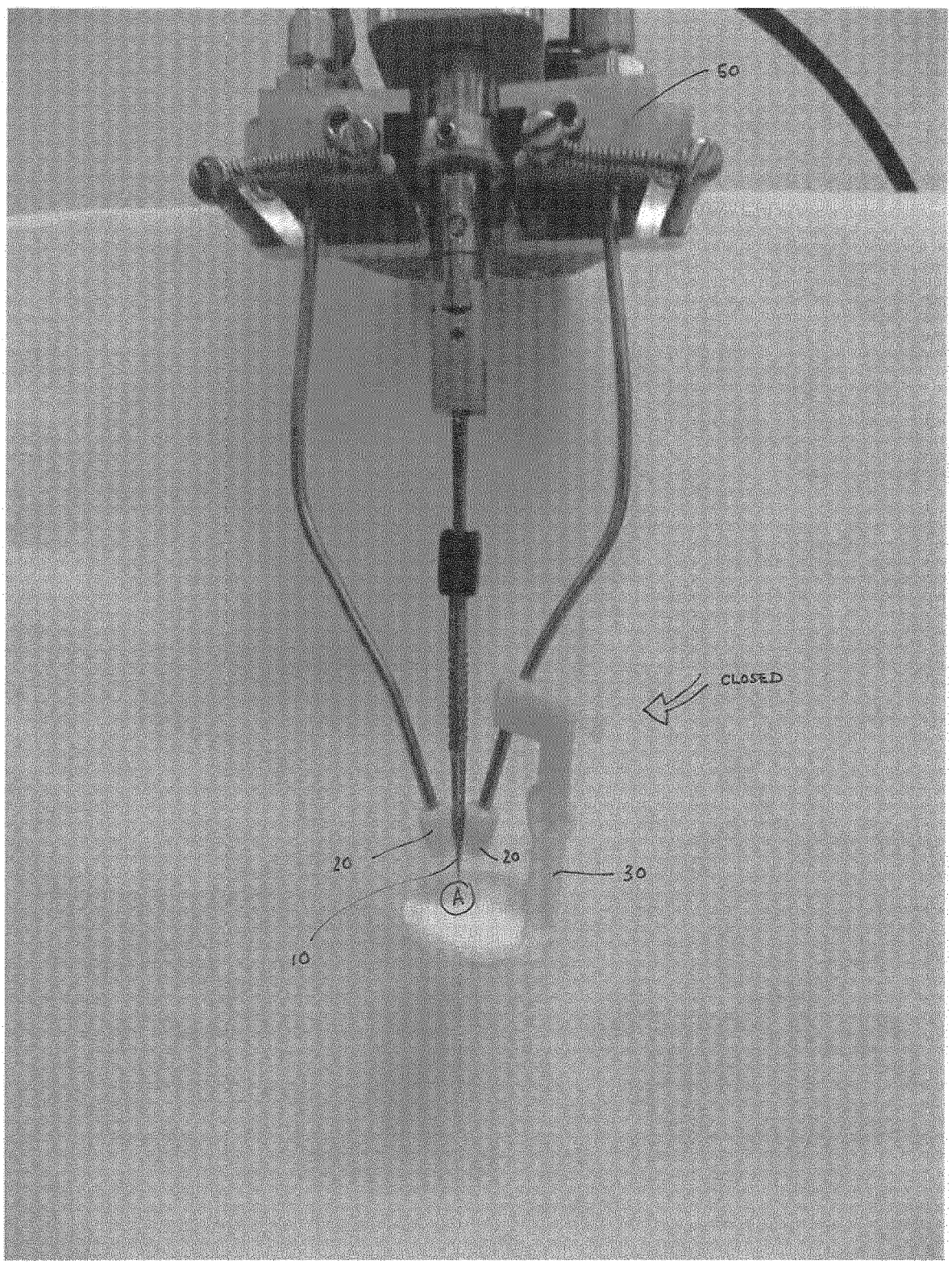
FIGS. 4a to 4c illustrate schematically operation of main components of the device of FIG. 3 when preparing a microscopy sample.
Figure 4B:
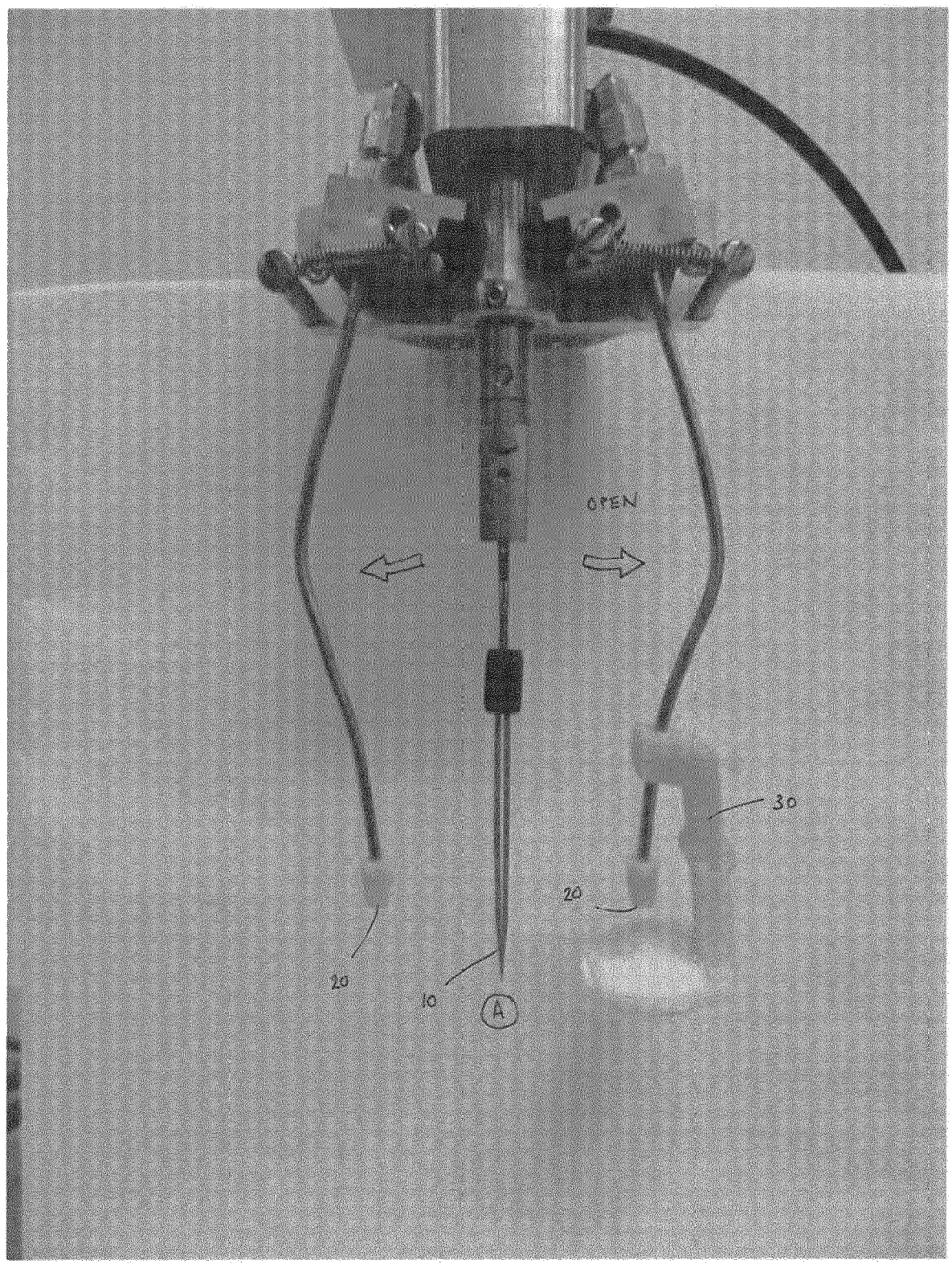
Figure 4C:
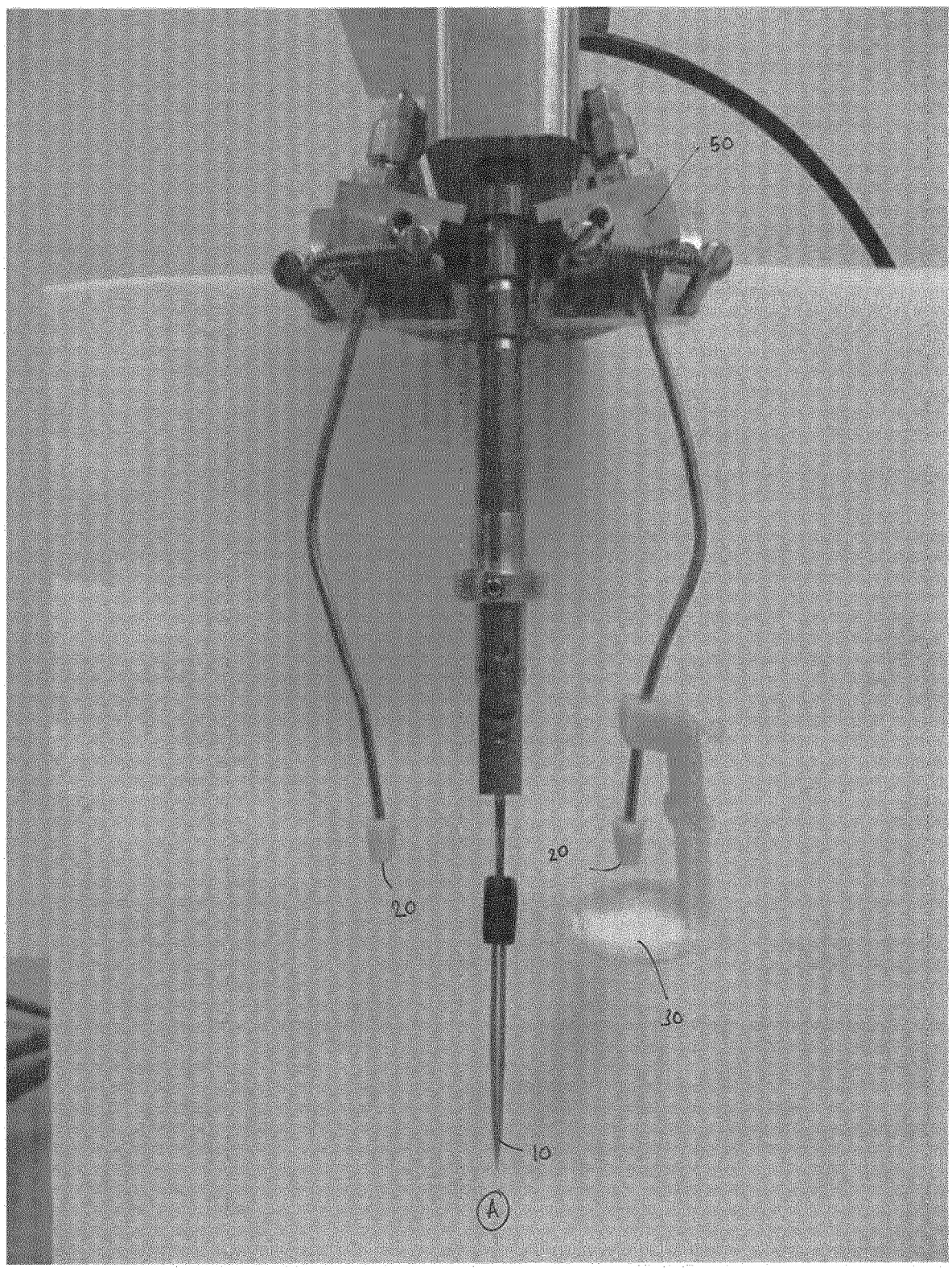

FIGS. 4a to 4c illustrate schematically operation of main components of the device of FIG. 3 when preparing a microscopy sample. As shown in FIG. 4a, two gas nozzles 20 are located in close proximity to the tip of tweezers forming the sample holder 10 in the example apparatus illustrated in FIG. 3. The sample holder will, when the apparatus is in use, hold a sample grid (not shown, but located in the region annotated A throughout FIG. 4. A shield 30 is provided below the grid and prevents the removed sample fluid from ending up in a bath of liquid ethane (not shown) typically located beneath the sample support holder. In the arrangement of FIG. 3 and FIG. 4 a mechanism 50 is provided to move the gas outlets 20 and shield 30 with respect to the sample holder 10, thus ensuring that the gas nozzles and shield are moved out of place and the tweezers can plunge down into liquid ethane (not shown) without obstruction. FIG. 4a shows the device in a closed state, as it would be during fluid sample adjustment, such as removal of the excess of the sample and subsequent adjustment of the fluid on the sample support using a controlled flow of gas. FIG. 4b shows the device in an open state in which the gas nozzles 20 and shield 30 are displaced by mechanism 50 such that the tweezers 10 holding the sample grid can move freely in a vertical or horizontal direction. FIG. 4c shows the device in an open state in which the tweezers 10 have been moved downwards by mechanism 50 so that a sample support can be moved towards and into a bath of liquid ethane to achieve rapid sample support vitrification (not shown).

Figure 5:
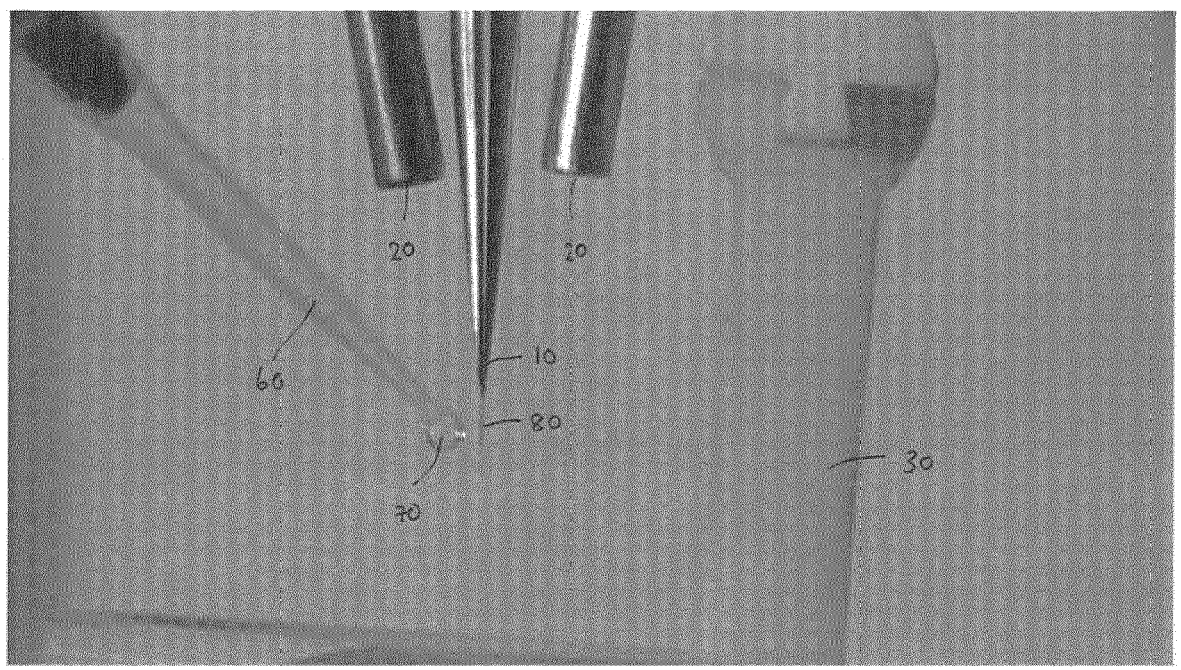
FIG. 5 illustrates introduction of a sample or specimen fluid to a sample support received by a device such as that shown in FIG. 3.

FIG. 5 illustrates introduction of a sample or specimen fluid to a sample support received by a device such as that shown in FIG. 3. In the example shown in FIG. 5 a pipette 60 is used to place a sample fluid 70 on support grid 80. It will be appreciated that some arrangements may allow for automatic dispensing of a sample onto a grid.

Figure 6:
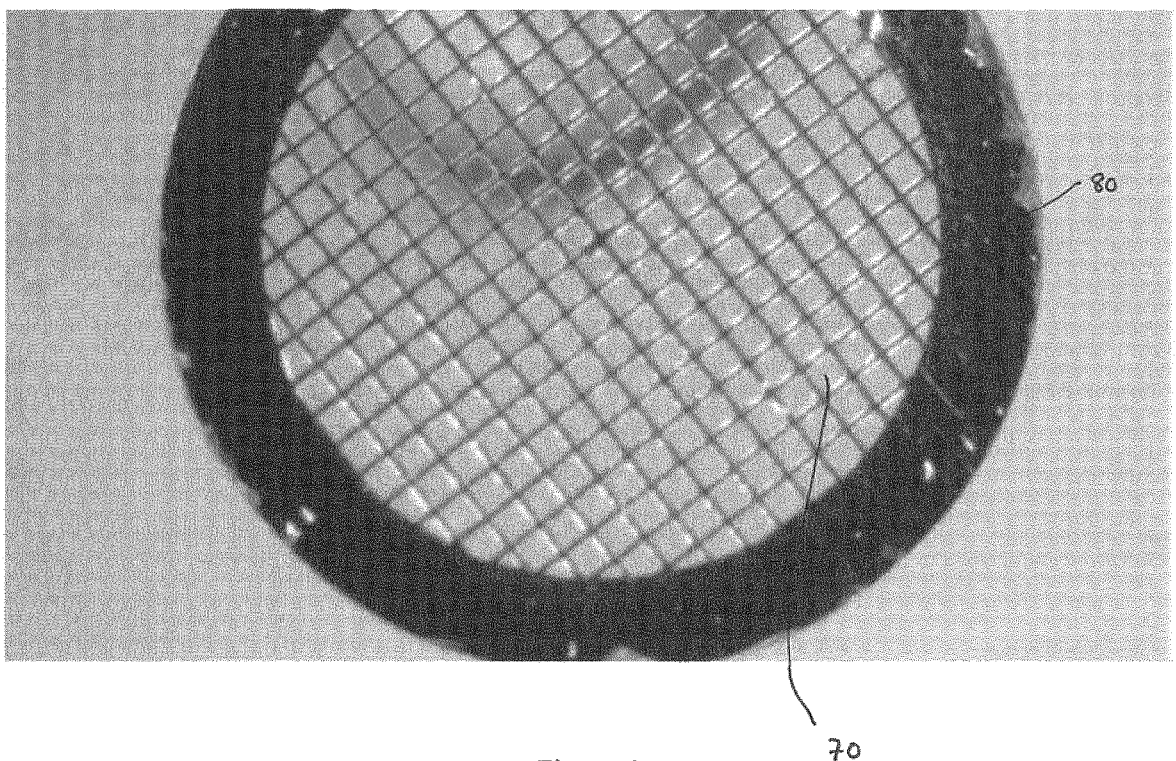
FIG. 6 is a view of a sample support as recorded by imaging apparatus included in a device such as that shown in FIG. 3.

FIG. 6 is a view of a sample support as recorded by imaging apparatus included in a device such as that shown in FIG. 3. The sample support 80 comprises a grid onto which sample fluid 70 has been dispensed. Provision of an imaging device 40 allows for analysis of the behaviour of the sample fluid 70 after it has been dispensed onto the grid 80, through a wait period, during which the fluid sample can be seen to "wet" the grid, through an active period, during which a gas flow is applied to the surface of the sample support and excess fluid is removed, and evaporation may occur, until cessation of an applied gas flow and through a relaxation period, between cessation of the gas flow and vitrification of a fluid sample on a sample support, during which the fluid may "relax" and redistribute itself upon the sample support.

Figure 7:
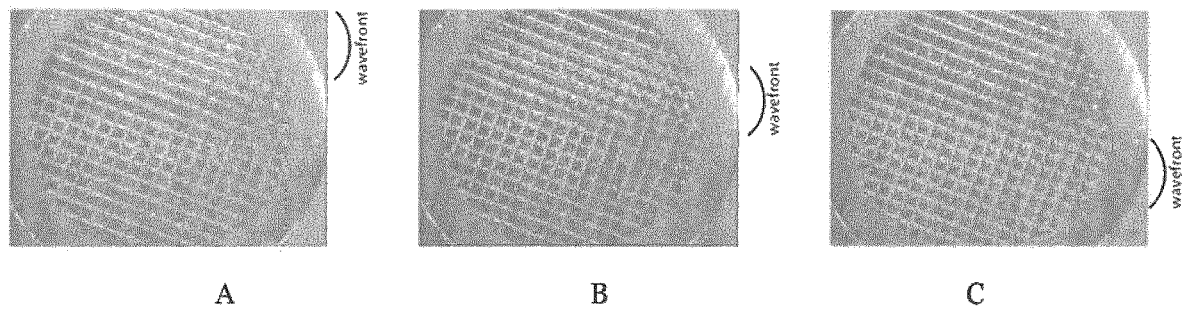
FIGS. 7a to 7c show behaviour of a sample on a sample support used in a device such as that shown in FIG. 3.

For example, FIGS. 7a to 7c show behaviour of a sample on a sample support used in a device such as that shown in FIG. 3 based on images captured, using imaging apparatus 40, of a sample fluid 70 after it has been dispensed onto the grid 80 and exposed to a gas flow from nozzles 20. In particular, FIGS. 7a to 7c provide an example of images captured using video which show movement of a wavefront across the grid when the fluid placed on the grid is subjected to a gas flow.

Fluid-Grid-Gas Interaction: Overview Video analysis of operation of an apparatus similar to that shown in FIG. 3 indicates that various stages occur in relation to the interaction between fluid placed on to a support and a flow of gas directed toward the sample support.

In particular, the following phenomena have been observed:

Introduction of the fluid sample to the grid occurs. Surface tension initially tends to hold the fluid sample in the general form of a droplet. Allowing a period of time (a "wait" period) to pass can allow the fluid sample to relax into the grid holes. That is to say, the fluid sample can be observed to "wet" the sample after initial introduction.

During an "active" period, during which a laminar flow of gas may be applied substantially parallel to the surface of the support surface, the flow of gas initially operates to remove excess sample fluid. That is to say, any residual bead of fluid sample which is present on the surface of the support is removed. Fluid sample which has wet/entered the grid spaces is typically not removed, provided the direction of the flow of gas is selected appropriately.

Figure 8A:
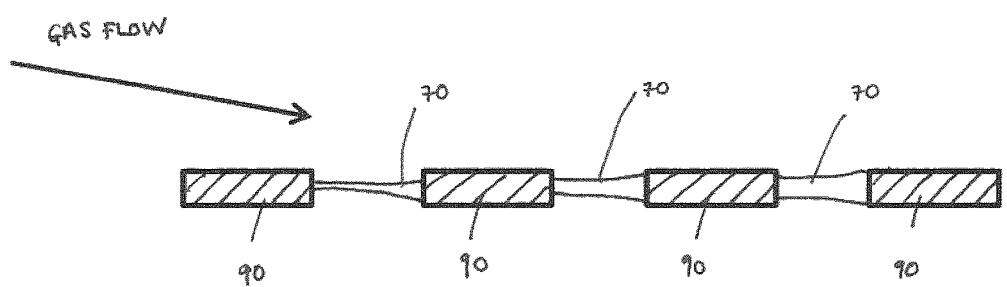
FIGS. 8a and 8b illustrate schematically behaviour of a fluid sample on a grid support.

Continued application of a laminar flow of gas applied substantially parallel to the surface of the support may result in the creation of a "gradient" of fluid sample in support squares of the grid as a result of a greater evaporation rate closer to the gas flow outlet. That is to say, the grid squares furthest from the gas outlet or source of gas flow tend to contain more fluid FIG. 8a illustrates schematically in cross section the typical behaviour of a fluid sample 70 between grid support bars 90. Such a gradient achieved across a sample support may be beneficial since it may ensure that somewhere on the support it is likely that an optimum fluid thickness for imaging a specimen within the fluid may be achieved.

Figure 8B:

Ceasing application of the laminar flow of gas and waiting for a so-called "relaxation" period allows a fluid sample between grid support bars to "relax" before any further action (for example, vitrification) is taken in relation to the sample support. Relaxation time allows fluid within a grid square to settle and counteract any asymmetric surface tension caused by application of the gas flow. As a result, the fluid within each grid or pore is likely to be more uniform. FIG. 8b illustrates schematically in cross section the typical behaviour of a fluid sample 70 between grid support bars 90 after removal of a gas flow.

Finally, a sample support including fluid sample may be vitrified. Typically vitrification is achieved by plunging the sample support into a bath of liquid ethane. It is recognised that in some arrangements it may be possible to use an appropriately selected further gas flow to achieve vitrification.

Figure 9:
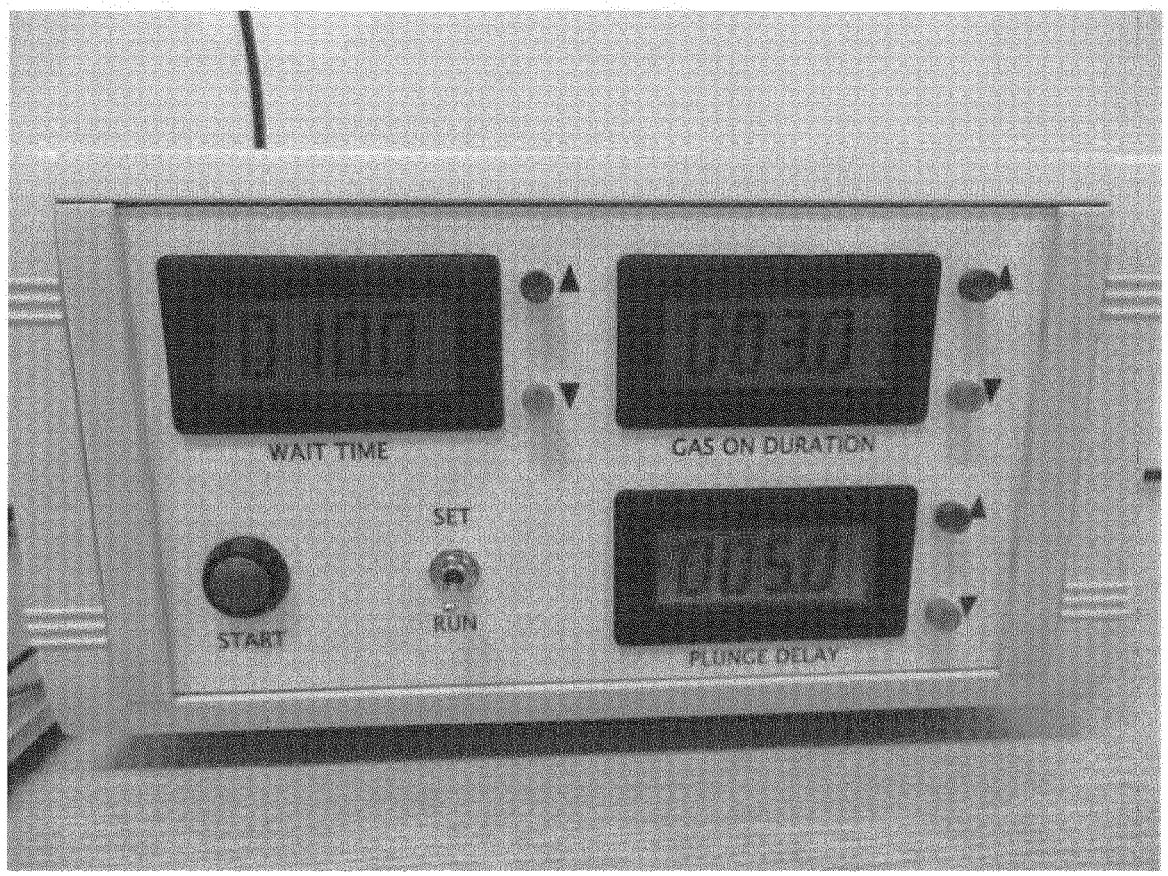
FIG. 9 illustrates a component of a device such as that shown in FIG. 3.
Figure 9:
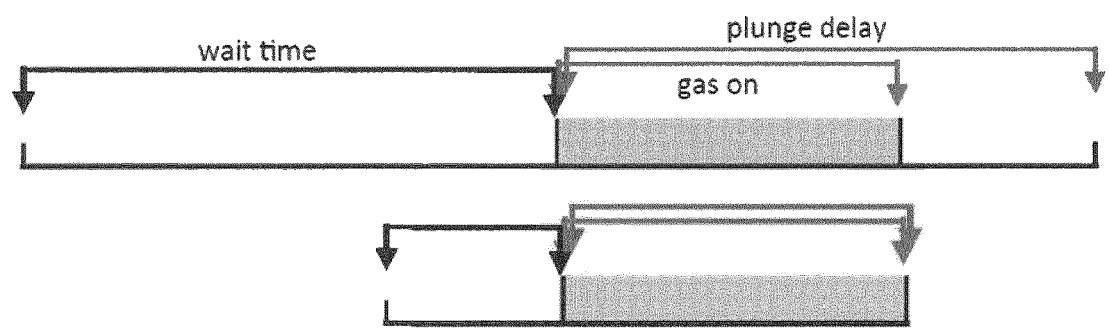

FIG. 9 illustrates a component of a device such as that shown in FIG. 3. Based on the preceding observations regarding the fluid interaction with a sample support, apparatus may be provided with a means to implement different variable time settings in relation to the different steps which occur during sample preparation process.

FIG. 9 shows an electronic switch allows for the setting of different times for: i) a wait time ("wait period") between application of a fluid sample to a support and initiation of a gas flow, such that the fluid sample can, for example, interact with a grid; ii) the duration of an applied gas flow ("active period"); and iii) a "relaxation" wait time ("relaxation period") between cessation of gas flow and a time at which the sample support is vitrified, for example by plunging the grid into liquid ethane.

Alternative Implementations

It will be appreciated that general operation of the device of FIG. 3 is illustrative of only one particular implementation of the general principle of using a flow of gas in the preparation of an electron microscopy sample.

In particular, various alternatives and additions to the arrangement described may be apparent to the skilled person.

In relation to the gas flow applied to a sample support, it will be appreciated that the direction of the flow may be of significance. A gas flow substantially parallel to the surface of the sample support may achieve efficient removal of excess fluid sample.

Application of a gas flow substantially perpendicular to the surface of the sample support may allow for a droplet of sample to be uniformly spread across the sample, and/or may allow for more uniform evaporation or cooling, as desired. The angle of incidence of a gas flow upon a sample support surface may be fixed or may be adjustable. The direction of gas flow applied to a sample may be adjusted during different phases of preparation.

It will further be appreciated that the rate of gas flow, width of gas flow and nature of gas flow (eg laminar or otherwise) may influence operation of a device. The rate of gas flow may be adjustable. The nozzle or outlet may, in some arrangements, be shaped to ensure a uniform laminar gas flow is incident across the surface of the sample support.

The type of gas used may be controlled. In particular, it may be desired to use one gas for adjustment of a fluid sample on a support and a further gas, which may be different to the first, in relation to gas flow achieving cooling or vitrification of a fluid sample on a sample support. Similarly, the humidity of the gas flow may be adjusted to control, for example, sample fluid evaporation.

In some arrangements, the temperature of the device and ambient surroundings may be controlled, again to ensure reproducibility of electron microscopy sample preparation.

In some arrangements, symmetrical gas flows may be applied to opposing surfaces of a sample support (such as in the arrangement of FIG. 3). In some arrangements, a single gas outlet may be provided. The single gas outlet may, for example, also be arranged to apply a gas flow symmetrically to opposing surfaces of a sample support.

In some arrangements, a single gas flow outlet may be configured to supply a gas flow to a single surface of the sample support to adjust the fluid sample. In some arrangements, a single gas flow outlet may be configured to supply a gas flow to a single surface of the sample support to cool the fluid sample.

Various alternative arrangements may provide for further functionality within the electron microscopy sample preparation device. In some arrangements, a cold nitrogen gas stream at 100 Kelvin may be applied to a sample support surface to vitrify the sample grid and fluid supported on the grid. Some arrangements may allow for automatic fluid sample application to a sample support, rather than requiring a user to manually pipette a sample fluid into position on a sample support. Automation of the fluid application may allow for use of smaller sample volumes. Manual application of the sample requires a volume of ~3 microlitres be deposited onto the grid. The majority of that sample will typically be removed during the puff of gas. Using nanolitre deposition techniques such as those used in protein crystallization robotics may allow for reduction of required sample volume approximately 10-fold, thereby saving precious sample.

In embodiments, the fluid sample comprises those specimens mentioned above and, in particular, ribosome small subunits, polymerase-DNA complexes, transcription factor-DNA complexes, protein samples, biological specimens, macromolecules, etc. The specimens are provided within a suspension fluid typically at around a 3-10 micromolar concentration. The specimen concentration is selected to provide typically a few specimens (such as macromolecules) present in each aperture in the sample support.

Embodiments recognise that in order to be able to construct an accurate image of a specimen (such as a macromolecule), the specimens need to be cryogenically suspended in a near-natural form and in multiple orientations in order to be able to build up a 3-dimensional image from imaging multiple specimens. In particular, embodiments recognise that disassociation of macromolecular complexes, subcomplexes, ligands, co-factors, etc, once the sample fluid has been received on the sample support, can occur. Also, evaporation of fluid, once the fluid sample is received by the support holder, can change buffer conditions that may be detrimental to the macro-molecule (such as increasing in salt concentration, changes in pH, etc).

Furthermore, once the fluid sample has been received by the sample support, the macro-molecules can interact with the air-liquid interface and become bound in a preferred orientation. Hence, embodiments seek to complete all processes between the fluid sample being deposited on the sample support and then being vitrified within a processing time period which eliminates or minimises the degree of disassociation and/or evaporation of fluid and/or reorientation to the preferred orientation.

Additionally, processing of the fluid sample on the sample support seeks to minimise change in concentration of the specimen within the sample. The concentration of specimens within the fluid is selected in order that a suitable number of specimens are present in each aperture of the sample support. By having sufficient number of specimens randomly suspended in a near-natural form and in multiple orientations, images of different specimens can be taken and combined to provide a three-dimensional view of the specimens.

In embodiments, an automated arrangement is provided for rapidly depositing, cleaving and vitrifying the fluid sample. For a typical specimen, the time from deposition onto the grid to vitrification should be in the sub-second range and typically less than around 100 ms. The automated arrangement is similar to that described above; however, an electromechanical injector (such as a small volume (25-100 microlitre) syringe) is used in place of the pipette 60 at a position of around 10 mm from the support grid to inject the sample fluid 70 onto the support grid 80.

Figure 10:
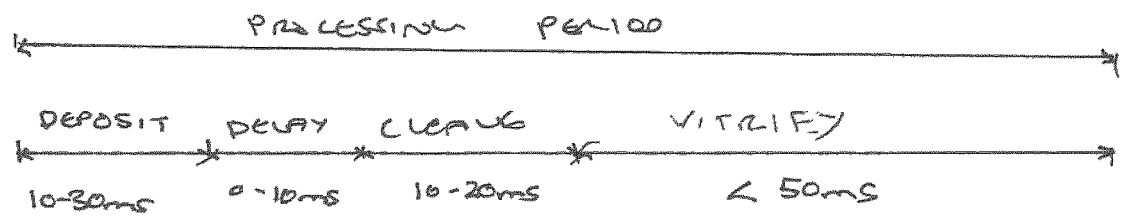
FIG. 10 is a timing diagram according to one embodiment.

FIG. 10 is a timing diagram showing the timing of the automated arrangement. In one embodiment, a 3 microlitre sample fluid is deposited by the electromechanical injector over a depositing period of between around 20 to 30 ms and more typically between around 10 to 15 ms. An optional delay of up to 10 ms may occur following this deposition. Once that optional delay period has expired, then the gas flow is applied from the gas nozzles 20 at a typical pressure of around between around 2 to 4 bar for a cleaving period around 10 to 20 ms. This cleaves the sample fluid, with excess sample fluid being separated or split from the remainder of the sample fluid which remains on the support grid 80. Once the cleaving has finished then the support grid 8o is translated so that it is received within the cooling bath within a vitrifying period of less than around 50 ms during which virtification occurs.

Hence it can be seen that embodiments shorten the time between sample application (the injection), the sample cleaving (the 'puff') and sample vitrifying (the plunge) to the millisecond time scale. This way the total handling time approaches the frequency by which the macro-molecules under study interact with the air-liquid interface and remain bound in a preferred orientation. By shortening the time, the number of air-water interface interactions are minimised which minimises the number of molecules bound in that preferred orientation. In addition, by working in the millisecond time scale, the contribution of evaporation of the sample is strongly reduced. This prevents changes in buffer conditions that may be detrimental to the macro-molecule (such as increase of salt concentration, changes in pH). This approach also allows for higher starting concentrations of the sample to be used (as it is no longer being concentrated during the grid preparation process), which is beneficial to weakly binding complexes that fall apart at lower concentrations.

It will be appreciated that the timing may need to be varied based on the viscosity of the fluid sample; more viscous samples may need a longer puff of the gas nozzles 20.

Alternatively, the support grid 80 can be made less hydrophylic by shortening the treatment time in the plasma chamber (i.e. glow discharge). In particular, the characteristics of the gas flow to achieve cleaving may be adjusted based on the physical arrangement of the apparatus and properties of the fluid sample.

It will be appreciated that in embodiments, the parameters mentioned above can be varied 2- to 3-fold.

In one embodiment, the support grid 8o is monitored by high resolution/high speed cameras which follow the sample deposition and sample cleaving. The final quality of the sample grid 80 is monitored by cryo-electron microscopy.

In one embodiment, the gas valves are located to be immediately in front of the gas nozzles 20.

In one embodiment, a strong (2-4 MBar) blast (puff) of gas is used to remove the excess of sample by force (not evaporation) from a cryo-EM grid. The gas stream may be parallel, under an angle, or perpendicular to the surface of the cryo-EM grid. There may be one or two gas streams operating on either side of the grid. Sample deposition, excess sample removal and vitrifying of sample occurs in such a manner that the whole procedure takes place at the sub-second time frame in order to: 1) prevent/reduce preferential orientation of the sample/macromolecule under investigation and/or 2) prevent/reduce dissociation of macromolecular complex, sub-complexes, ligands, co-factors etc. and/or 3) prevent/reduce evaporation of the sample.

Although illustrative embodiments of the invention have been disclosed in detail herein, with reference to the accompanying drawings, it is understood that the invention is not limited to the precise embodiment and that various changes and modifications can be effected therein by one skilled in the art without departing from the scope of the invention as defined by the appended claims and their equivalents.

The invention claimed is:

1. Electron microscopy sample preparation apparatus; said apparatus comprising:
   a support holder configured to receive an electron microscopy sample support, said electron microscopy sample support configured to receive a fluid sample; and
   a gas outlet configured to direct a flow of gas towards a surface of said electron microscopy sample support at an angle of incidence selected such that said flow of said gas is operable to adjust said fluid sample by removing excess fluid sample supported by said electron microscopy sample support.

2. Apparatus according to claim 1, wherein said gas outlet is configured such that said flow of gas is directable towards said surface such that flow of said gas is substantially parallel to said surface.

3. Apparatus according to claim 1 wherein said gas outlet is configured to be moveable such that said gas flow has an adjustable angle of incidence with respect to flow of said gas towards said surface.

4. Apparatus according to claim 1, wherein said flow of gas from said gas outlet configured for adjusting said fluid sample supported by said electron microscopy sample support further comprises operation by one or more of: causing non-uniform evaporation of fluid sample supported by said electron microscopy sample support to obtain a fluid sample thickness gradient across said sample support causing uniform evaporation of fluid sample supported by said electron microscopy sample support to obtain a uniform fluid sample thickness across said sample support; and causing cooling of fluid sample supported by said electron microscopy sample support to vitrify said fluid sample on said sample support.

5. Apparatus according to claim 1, wherein said apparatus comprises: at least one gas outlet configured to direct said flow of gas substantially symmetrically towards opposing surfaces of said electron microscopy sample support to adjust fluid sample supported by said electron microscopy sample support.

6. Apparatus according to claim 1, wherein said apparatus comprises: a fluid source configured to introduce said fluid sample to said sample support.

7. Apparatus according to claim 1 wherein said apparatus comprises: a timing unit configured to implement one or more of: a wait period between introduction of fluid sample to said sample support and activating said gas flow from said gas outlet an active period between activation and cessation of said gas flow from said outlet a relaxation period between cessation of said gas flow from said outlet and a further action taken in relation to a sample support held in said sample holder.

8. Apparatus according to claim 7, wherein said timing unit is configurable to adjust one or more of said wait period, active period or relaxation period.

9. Apparatus according to claim 1, wherein said gas outlet is configured to direct said flow of gas to cleave said fluid sample received on said sample support.

10. Apparatus according to claim 1, wherein said gas outlet is configured to direct said flow of gas to cleave said fluid sample received on said sample support into a retained portion of said fluid sample retained on said sample support and a removed portion of said fluid sample removed from said sample support.

11. Apparatus according to claim 1, comprising a fluid sample depositor operable to deposit said fluid sample on said sample support.

12. Apparatus according to claim 11, wherein said apparatus comprises a control unit operable to control said fluid sample depositor, said gas outlet and said cooling device to deposit said fluid sample, cleave said fluid sample and vitrify said retained portion within a processing period.

13. Apparatus according to claim 12, wherein said processing period comprises a time period within which greater than a selected proportion of said specimens in said retained portion are prevented from at least one of disassociating and reorientating to an aligned orientation.

14. Apparatus according to claim 13, wherein said time period is less than around 100 ms.

15. A method of preparing an electron microscopy sample preparation; said method comprising:
  inserting an electron microscopy sample support into a support holder;
  providing a fluid sample to said electron microscopy sample support; and
  directing a flow of gas towards a surface of said electron microscopy sample support at an angle of incidence selected such that said flow of said gas is operable to adjust said fluid sample by removing excess fluid sample supported by said electron microscopy sample support.

* * * * *